United States Patent [19]

Moum

[11] Patent Number: 5,130,648
[45] Date of Patent: Jul. 14, 1992

[54] INSTRUMENT FOR CHECKING THE OPERATIONAL STATE OF AN IC-CIRCUIT

[76] Inventor: Kjell Moum, Ängsullsvägen 62, S-162 46 Vällingby, Sweden

[21] Appl. No.: 663,811
[22] PCT Filed: Sep. 12, 1989
[86] PCT No.: PCT/SE89/00489
§ 371 Date: Feb. 28, 1991
§ 102(e) Date: Feb. 28, 1991
[87] PCT Pub. No.: WO90/02926
PCT Pub. Date: Mar. 22, 1990

[30] Foreign Application Priority Data

Sep. 12, 1988 [SE] Sweden .................... 8803198

[51] Int. Cl.$^5$ ............................................. G01R 31/28
[52] U.S. Cl. ................................ 324/158 R; 371/22.6
[58] Field of Search ............. 324/158 R, 158 T, 73.1, 324/158 P; 371/22.6

[56] References Cited

U.S. PATENT DOCUMENTS

| | | | |
|---|---|---|---|
| 3,870,953 | 3/1975 | Boatman et al. | 324/158 T |
| 4,132,946 | 1/1979 | Holdren et al. | 324/158 P |
| 4,439,858 | 3/1984 | Petersen | 371/20 |
| 4,484,329 | 11/1984 | Slamka et al. | 371/25 |
| 4,583,223 | 4/1986 | Inoue et al. | 371/20 |
| 4,588,945 | 5/1986 | Groves et al. | 371/22.6 |
| 4,654,850 | 3/1987 | Rodrigues | 371/25 |
| 4,827,208 | 5/1989 | Oliver et al. | 371/22.6 |

FOREIGN PATENT DOCUMENTS 0242255 10/1987 European Pat. Off. ............. 371/25

OTHER PUBLICATIONS

Modern Elektronik, vol. 17, 1983, Rick Robinson "In-Circuit Test Kortar Liuslangen?", pp. 35-38.

Primary Examiner—Ernest F. Karlsen
Attorney, Agent, or Firm—Nies, Kurz, Bergert & Tamburro

[57] ABSTRACT

An instrument for checking the operational state of IC-circuits, and particularly for checking the operational state of current-conducting IC-circuits on an electronic card or board, the instrument including an electronic circuit which is operative to control and evaluate signals to and from the pins of the IC-circuit, and further including a test clip which is connected to the electronic circuit and which is intended for connection to the pins of an IC-circuit. The invention is characterized in that the electronic circuit includes a microprocessor (10) which is programmed with logic functions intended for one or more IC-circuits, and further includes a sequence logic circuit (14) which is operative to control so-called switches (15) which, via the test clip (4), can be connected to the pins of the IC-circuits in a sequence predetermined for each IC-circuit. The switches (15) are operative to apply on respective inputs of the IC-circuit a short pulse of high current strength, the high current strength of which pulse is sufficient for the input concerned to adopt a predetermined state, irrespective of the influence exerted on the input by any other circuits that may possibly be connected to the IC-circuit, and the duration of which pulse is of sufficiently short duration to ensure that the IC-circuit will not be damaged at said current strength; and in that the microprocessor (10) is operative to compare output signals which occur in the IC-circuit in response to pulses applied to said IC-circuit with the logic functions of the IC-circuit concerned.

8 Claims, 2 Drawing Sheets

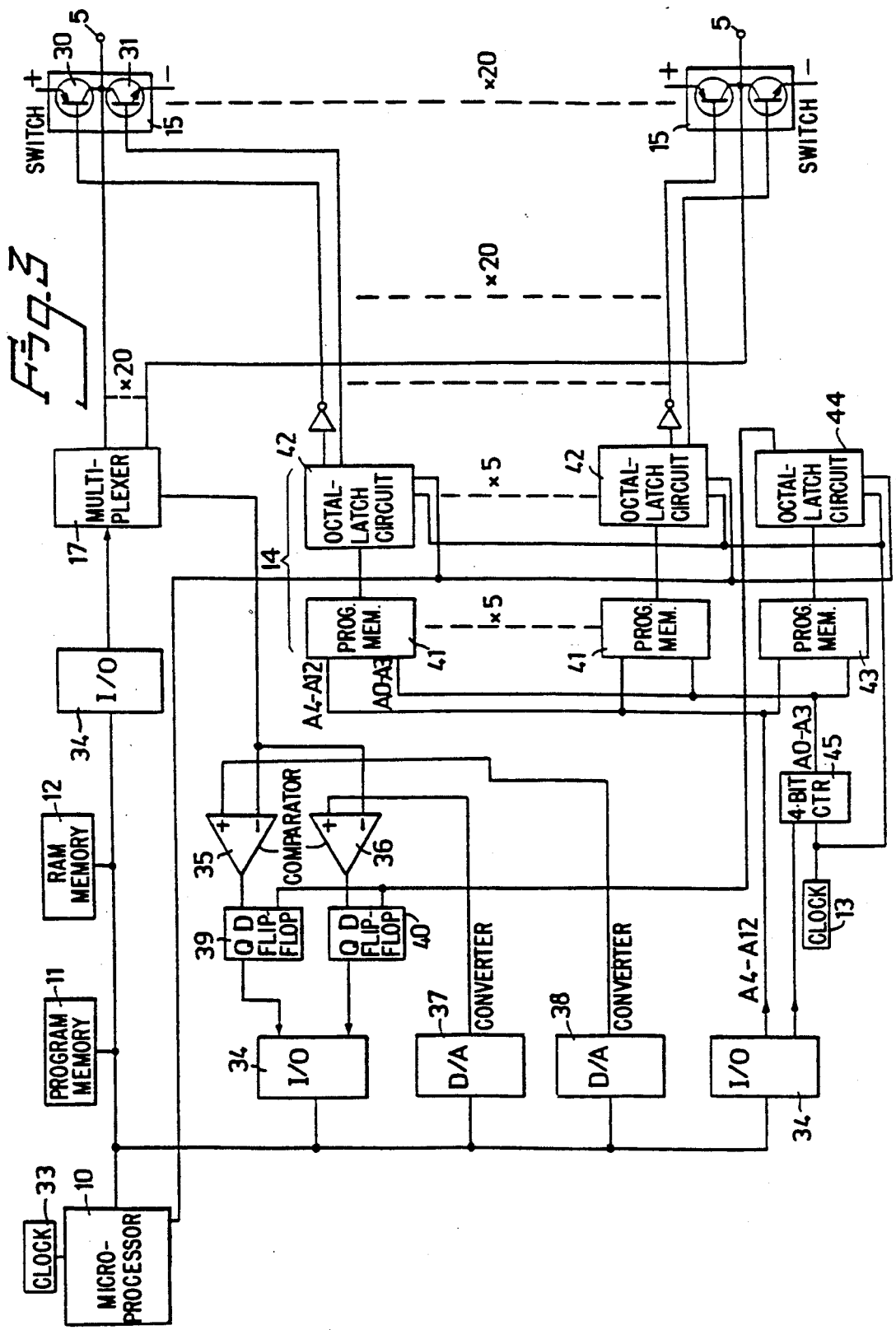

INSTRUMENT FOR CHECKING THE OPERATIONAL STATE OF AN IC-CIRCUIT

The present invention relates to an instrument for checking the operational state of integrated circuits, so-called IC-circuits.

When testing an electronic board or card for faults, one problem encountered is the difficulty in pointing to a specific faulty, non-functioning IC-circuit. It is seldom that a given faulty IC-circuit can be indicated with the aid of known equipment. Normally, it is only possible to point to a group of components which contain a faulty IC-circuit, such as a whole electronic board for instance.

In the case of electronic boards which include a microprocessor, equipment is found which will stimulate the microprocessor. This involves substituting the microprocessor for a processor which will behave in the same manner as the microprocessor and which will emit pulses on the board similar to those emitted by the microprocessor. Such pulses stimulate the IC-circuits on the board and give rise to so-called signatures, i.e. output signals on the various board inputs and outputs, these output signals either being static or comprising sequences of output signals. Since the appearance of the signatures generated on a fault-free board is known, the signatures are compared with said pulses, so as to establish whether or not the board is faulty, and if so where the fault lies.

However, when establishing that a board is faulty, it remains to isolate the faulty IC-circuit. In the case of data buses and address buses, for instance, it is not unusual for about 10-20 IC-circuits to influence a given signature.

Furthermore, when an external processor is connected to the board, it is necessary to disengage the board from its normal conductive state.

A further problem arises when an electronic board is not fitted with a microprocessor. In this case, the IC-circuits can be stimulated, for instance, through a so-called short-edge contact. It is highly improbable, however, in this case that the faulty IC-circuit will be located within a reasonable time period.

Consequently, there is a great need, and also a great desire, for an instrument by means of which a faulty IC-circuit can be detected from a plurality of IC-circuits on an electronic board.

It is also desirable that detection of a faulty IC-circuit can be effected without disconnecting the board, i.e. that said detection can be effected while the board conducts current.

Such an instrument would, inter alia, render it unnecessary to scrap the whole of the board, and therewith enable the board to be repaired, by simply replacing the faulty IC-circuit.

The present invention provides such an instrument by means of which IC-circuit by IC-circuit can be checked and which will enable the check to be made while voltage is applied to the board in a normal manner.

The invention results in significant savings in costs, partly because the time taken to establish a fault is greatly reduced, and partly because a faulty card can be repaired instead of being scrapped.

The present invention thus relates to an instrument for checking the operational state of IC-circuits, and particularly for checking the operational state of current-conducting IC-circuits located on electronic boards or cards, said instrument including an electronic circuit which is operative to control and evaluate the signal to and from the pins of the IC-circuit, and which further includes a so-called test-clip which is connected to the electronic circuit and which is intended to be connected to the pins of an IC-circuit, said instrument being characterized in that the electronic circuit includes a microprocessor which is programmed with logic functions intended for one or more IC-circuits and which includes a sequence logic circuit operative to control electronic switches which via the test-clip can be connected to the pins of the IC-circuit, in a sequence which is predetermined for each IC-circuit, said switches being operative to apply to the respective inputs of the IC-circuit a short pulse of high current strength, said pulse having a sufficiently high current strength for the input concerned to adopt a predetermined state irrespective of the influence exerted on said input by other circuits which may possibly be connected to the IC-circuit, and the duration of which pulse is sufficiently short to ensure that the IC-circuit will not be damaged by said current strength; and in that the microprocessor is operative to compare output signals from the IC-circuits in depedence on pulses applied to the IC-circuit with said logic functions of the IC-circuit concerned.

The invention will now be described in more detail with reference to exemplifying embodiments of the invention illustrated in the accompanying drawings, in which FIG. 1 is a block schematic illustrating the instrument;

FIG. 3 illustrates an exemplifying embodiment of the instrument in more detail.

Figure 2:
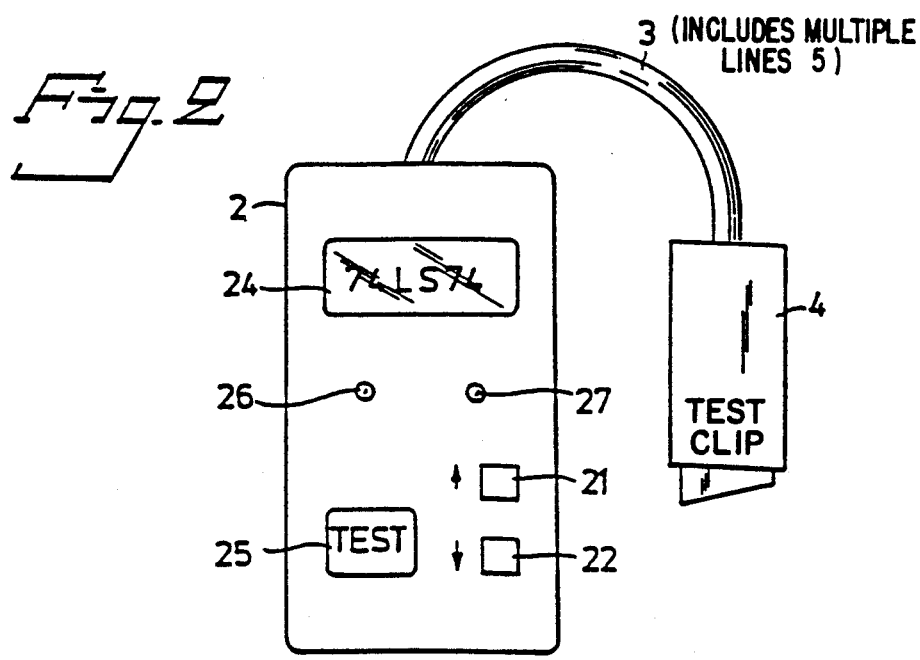
FIG. 2 is a graphic illustration of the instrument.

As will be seen from FIG. 2, the instrument includes an electronic circuit 1 which is encapsulated in a box 2. The circuit is intended to control and evaluate signals passing to and from the pins of an IC-circuit. The instrument also includes a suitable known kind of test clip 4 which is connected to the electronic circuit 1 by means of a multi-cable 3. The test clip 4 is thus intended to be connected to the pins, i.e. inputs and outputs, of the IC-circuit.

Figure 1:
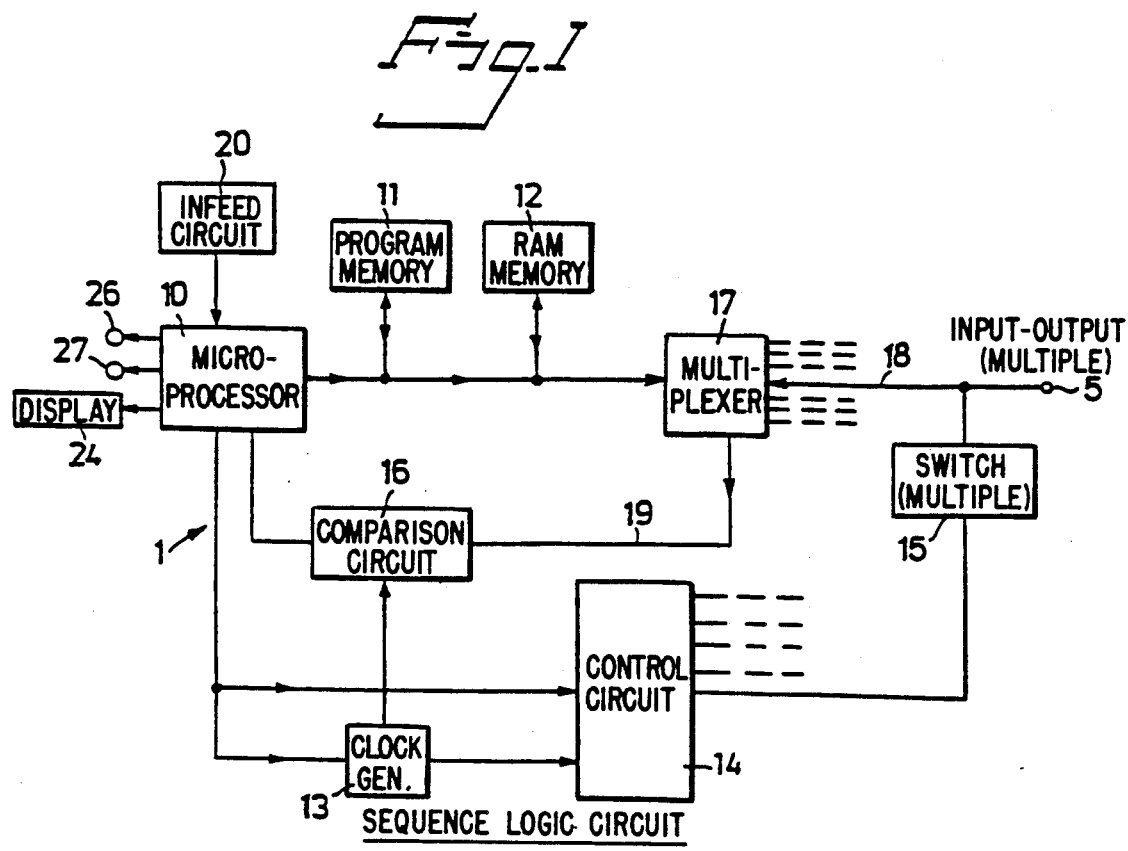
FIG. 1 is a block schematic illustrating an instrument constructed in accordance with the invention.

The reference numeral 5 in FIG. 1 identifies the input and output from the electronic circuit 1 to the cable 3.

In accordance with the invention, the electronic circuit includes a microprocessor 10 to which there is connected a program memory 11 and a RAM-memory 12. The microprocessor 10 is programmed with logic functions intended for one or more IC-circuits. The electronic circuit also includes a sequence logic circuit 13, 14 which is operative to control electronic solid state switches 15 which can be connected, via the test clip 4, to the pins of the IC-circuit in a sequence which is predetermined for each IC-circuit.

In accordance with one preferred embodiment of the invention, the switches are transistor switches, each of which comprises two transistors 30, 31, see FIG. 3, of which the emitter of one transistor 30 is connected to a positive voltage and the emitter of the other transistor 31 is connected to negative voltage. The bases of respective transistors are connected to a program memory from which the voltage is applied.

The positive voltage is preferably +5V and the negative voltage −0.7 V.

The sequence logic circuit includes a clock generator 13 which is operative to control a control circuit 14 and to cause said circuit to deliver signals to different switches in a predetermined sequence. The sequence which is to be applied when testing a given IC-circuit is determined by the microprocessor, which is operative to deliver to the sequence logic circuit information which determines the relevant sequence. A more detailed, exemplifying embodiment is described hereinafter in the form of a circuit in which the sequence logic circuit includes the program memories which are addressed by the microprocessor and which are programmed to activate said switches in a given sequence in response to control signals from the microprocessor, and which further includes so-called octal-latch circuits by means of which the signals from the program memories are clocked-out to the switches 15 by the clock generator 13.

The inventive electronic circuit 1 also includes a comparison circuit 16 which is operative to compare the signals arriving from the pins of an IC-circuit with a set-point value set by the microprocessor. The clock circuit 13 is also operative to cause the comparison circuit 16 to send to the microprocessor a signal which illustrates the results of such a comparison. Thus, activation of the switches is synchronized with the comparison with the set-point values of those signals which then occur on the pins of the IC-circuit.

Although only one input and output 5 is shown in FIG. 1, it will be understood that in reality, the number of inputs and outputs will equal the number of pins provided on the IC-circuit in question, i.e. preferably up to twenty inputs and outputs and twenty switches 15. This is illustrated by the broken lines departing from the circuit 14 and a circuit referenced 17. The circuit 17 is a multiplexer or some other circuit operative to connect different conductors 18 with the conductor 19. The circuit 17 is intended to be controlled by the microprocessor with respect to those conductors which are to be connected.

Thus, the instrument is used to apply a voltage on one or more pins, the signal level on one or more of the remaining pins being read-off.

In this case, the microprocessor is operative to compare output signals transmitted by the IC-circuit in response to pulses applied thereto, with the aforesaid logic functions of the IC-circuit concerned, and therewith to ascertain whether or not the IC-circuit functions correctly.

Thus, in accordance with one preferred embodiment of the invention, the electronic circuit 1 includes a multiplex circuit 17 or the like which is controlled by the microprocessor 10 and which is operative to connect one or more of the pins of an IC-circuit to the comparison circuit 16. The level of the voltage on the pins constitutes a real value. The microprocessor 10 is operative to send a set-point value signal to the comparison circuit in response to the switch-over points of the IC-circuit in respect to high and low signal levels.

One highly essential feature of the present invention is that the switches 15 are intended to apply a short pulse of high current strength to respective inputs, i.e. pins, of the IC-circuit, the current strength of said pulse being sufficiently high for the input concerned to adopt a predetermined state, irrespective of the influence exerted on the input by any other circuits which might be connected to the IC-circuit. In accordance with the invention, the duration of the pulses is such as not to damage the IC-circuit concerned at said current strength.

The switches are operative to drive respective inputs to either a high or a low state. Because the clock circuit 13 is driven by the sequence logic circuit, the pulses applied to respective switches can be of very short duration, even though the microprocessor 10 is relatively slow.

This essential feature of the invention thus enables the operational state of IC-circuits to be checked with the circuits in current-conducting state. Furthermore, a check can be carried out quickly, since the test clip can be fitted quickly across the IC-circuit, whereafter the microprocessor controls the check and evaluates the result in a very short space of time.

According to one preferred embodiment of the invention, the instrument is programmed with logic functions intended for several IC-circuits. The information required herefore is programmed in the program memory 11.

Connected to the microprocessor 10 is an infeed circuit 20 from the instrument 2 which includes buttons 21, 22 intended to be manipulated by the operator. The instrument is also provided with a display 24. The operator is able to advance the microprocessor by means of the buttons 21, 22 for instance, such as to cause the electronic circuit to check different IC-circuits. For instance, the functions of a hundred different IC-circuits may be stored for the purpose of checking these IC-circuits.

According to one preferred embodiment, the microprocessor is operative to cause the display 24 to indicate the IC-circuit for which the instrument is set to check. FIG. 2 exemplifies this feature with an IC-circuit designated "74LS74".

The instrument is also fitted with a button 25 (FIG. 2) which belongs to the circuit 20, by means of which a pulse is sent to the microprocessor 10, causing the microprocessor to initiate an IC-circuit checking procedure.

The instrument is preferably provided with a red 26 and a green 27 photodiode, for the purpose of activating the microprocessor in dependence on whether the check has shown the IC-circuit concerned to be faulty or not.

The invention is described in more detail here below with reference to FIG. 3, which illustrates an exemplifying embodiment of the electronic circuit of the instrument. The circuit illustrated in FIG. 3 has the same basic construction as the circuit illustrated in block-schematic form in FIG. 1.

The microprocessor 10 may be an Intels microprocessor 8085, which is driven by means of a clock 33 at a frequency of 6.144 MHz. A program memory 11 EPROM 2764 and a RAM-memory 12 RAM 6264 are connected to the microprocessor. The circuit 8255 for instance can be selected as the input and output circuit (I/O) 34. For the sake of illustration, one and the same input and output circuit in FIG. 3 has been divided into three circuits 34. The circuit 8255 has 24 lines, which may be inputs or outputs.

The FIG. 3 embodiment also includes the aforesaid comparison circuit, which comprises two comparitors 35, 36, to which a set-point signal is applied in addition to the measuring signal (the real-value signal). The set-point signal is determined by the microprocessor 10, the digital signals of which are converted to analogue signals in two digital/analogue converters (D/A) 37, 38.

The outputs from the comparitors 35, 36 are each connected to a respective D-type flip-flop 39, 40.

The illustrated embodiment also includes the aforementioned clock circuit 13 and the sequence logic circuit 14. The sequence logic circuit incorporates 5 program memories EPROM 41, and 5 known OCTAL-LATCH circuits 42. The clock 13 may be driven at a frequency of 4 MHz, for instance.

The reference sign "x5" thus indicates the presence of 5 EPROM and 5 OCTAL-LATCH circuits, despite only two being shown.

The reference sign "x20" indicates the presence of 20 twin-conductors, where each conductor is connected to the base of a transistor. All pins of an IC-circuit are thus connected simultaneously to two transistors.

The illustrated embodiment also includes an additional program memory 43 and an additional OCTAL-LATCH circuit 44, for controlling the aforesaid D-type flip-flops 35, 36.

In accordance with one preferred embodiment of the invention, the clock circuit 13 is operative to control the aforesaid sequence logic circuit and also the D-type flip-flops, whereby application of the aforesaid pulses to said pins and the aforesaid comparison carried out in the comparison circuit are mutually synchronized.

The embodiment also includes a 4-bit counter 45. This counter is also controlled by the clock circuit and is operative to step forward the program memories 41 in successive increments.

It is only possible to carry out one measurement at a time when using the embodiment illustrated in FIG. 3, since only one comparison circuit is provided.

The aforesaid multiplexer is an analogue MUX, which is addressed via the I/O-circuit 34 so that the signal on the pin intended is applied to the comparitors 35, 36. The multiplexer has 20 inputs, as shown to the right of FIG. 3.

The sequence logic is constructed, so that each complete measuring operation is preceded by up to 15 events, clocking of the output signals from the comparitors into the D-type flip-flops 39, 40 being the 16th event.

Setting of the multiplexer 17 for measuring on a given pin is an example of one such event. The application of a given level on the inputs of the circuit to be measured is a further example of these events.

A test cycle is effected in the following manner:

A given IC-circuit is selected. The IC-circuit designation is stepped forwards on the display, wherewith the microprocessor initiates a start address for the intended test cycle, by selecting the address lines A4-A12 on all of the program memories 41, 43. The outputs of the counter 45 are connected to the address lines A0-A3 on said program memory. The counter 45 is then triggered, so as to count from 0 to 15. Data from the program memories 41 is clocked into the OCTAL-LATCH circuits 42, at the same time as new addresses are clocked forwards by means of the counter. The outputs from the OCTAL-LATCH circuits 42 control respective bases on the transistors concerned.

The output signal from a pin is applied via the multiplexer comparitors, the output signals of which are clocked into the D-type flip-flops. The microprocessor reads the output signal from the D-type flip-flops and compares this signal with the output signal which a non-faulty IC-circuit shall deliver when the input signals applied to the pins of the IC-circuit prevail.

Since only the output signal from one pin is measured at a time, the test cycle is repeated the number of times, which is necessary in order to check the various functions of the whole of the IC-circuit.

It will be obvious that the problems mentioned in the introduction are completely overcome when practicing the present invention.

It will also be obvious that the ability to measure IC-circuits while in their operative, current-conducting states is an important advantage.

The invention has been described above with reference to different exemplifying embodiments thereof.

It will be obvious to one skilled in this art, however, that the electronic instrument may have a construction different to that described above and illustrated in FIGS. 1 and 3.

Consequently, the invention shall not be considered to be restricted to the aforedescribed embodiments thereof, since modifications can be made within the scope of the following claims.

I claim:

1. An instrument for checking the operational state of IC-circuits, including checking the operational state of IC-circuits of electronic circuit boards while the circuits are in their operative, current-conductive state, said instrument comprising: an electronic circuit including a microprocessor, operative to control signals to the pins of an IC-circuit in a predetermined sequence for the IC-circuit in question, which signals comprise a pulse, and which electronic circuit includes means operative to control and evaluate signals form the pins of the IC-circuit, and which electronic circuit (10) also includes means operative to compare, with the logic functions of the IC-circuit concerned, output signals which occur in the IC-circuit in response to pulses applied to said IC-circuit, and which instrument further includes a test clip which is connected to said electronic circuit and which is adapted to be connected to the pins of an IC-circuit, said instrument further comprising that said electronic circuit includes said microprocessor (10) which is programmed with logic functions intended for one or more IC-circuits, and also includes a sequence logic circuit (14; 41-45) with program memories, said sequence logic circuit being operative to control a plurality of solid state switches (15) adapted to be connected to the pins of the IC-circuit, via said test clip (4), in a sequence predetermined for each IC-circuit, said switches (15) being operative to apply to respective inputs of the IC-circuit, when connected thereto, a short pulse of high current strength, the high current strength of which pulse is sufficient for the input concerned to adopt a predetermined state, irrespective of the influence exerted on said input by any other circuits, including operational circuits, that may possibly be connected to the IC-circuit, and the duration of which pulse is sufficiently short to ensure that the IC-circuit will not be damaged by said current strength.

2. An instrument according to claim 1, wherein said electronic circuit (1) further includes a comparison circuit and a multiplex circuit (17) which is controlled by the microprocessor (10) and which is therewith operative to connect at least one of the pins of an IC-circuit to said comparison circuit (16; 35, 36), the voltage level on said pins constituting a real value; and wherein said microprocessor (10) is operative to apply to said comparison circuit (16; 35, 36) a set-point value in response to the switch-over points of the IC-circuit with respect to high and low signal levels respectively; and wherein the comparison circuit (16; 35, 36) is operative to apply an output signal to the microprocessor (10).

3. An instrument according to claim 1, wherein said sequence logic circuit (14; 41-45) includes a plurality of EPROM program memories (41), which are programmed to control said solid state switches (15) in a given sequence in response to control signals from said microprocessor (10), a plurality of OCTAL-LATCH circuits are included in said electronic circuit, and said program memories (41) are connected to said switches (15) via said OCTAL-LATCH circuits 4. An instrument according to claim 1, further including a clock circuit (13), which is connected to and is operative to control said sequence logic circuit (14; 41-45), and D-type flip-flops (39, 40) are connected between said comparison circuit (16; 35, 36) and said microprocessor (10), thereby synchronizing the application of said pulses and said comparison carried out in the comparison circuit.

5. An instrument according to claim 4, wherein said electronic circuit further includes a counter connected between said clock circuit and said program memories and said clock circuit (13) is operative to control said counter (45) and to step said program memories (41, 43) forward successively, and also to control said OCTAL-LATCH circuits (42, 44) to connect the program memories (41) with said switches.

6. An instrument according to claim 1, wherein said solid state switches (15) are transistor switches each switch comprising two transistors (30, 31), wherein the emitter of one transistor (30) is connected to a positive voltage and where the emitter of the other transistor (31) is connected to a negative voltage, and where the individual base of each respective transistor (30, 31) is connected to a program memory (41).

7. An instrument according to claim 6, wherein the positive voltage is about +5 V and the negative voltage is about −0.7 V.

8. An instrument according to claim 1, wherein the electronic circuit of the instrument includes a display and is programmed with logic functions for several IC-circuits; and wherein said microprocessor (10) is operative to control said display (24) on the instrument to indicate the IC-circuit for which the instrument has been set to check.

* * * * *